US008009000B2

(12) United States Patent
Bluemler et al.

(10) Patent No.: US 8,009,000 B2
(45) Date of Patent: Aug. 30, 2011

(54) APPARATUS FOR APPLICATION OF A MAGNETIC FIELD TO A SAMPLE

(75) Inventors: Peter Bluemler, Juelich (DE); Helmut Soltner, Inden (DE)

(73) Assignee: Forschungszentrum Juelich GmbH, Juelich (DE)

(*) Notice: Subject to any disclaimer, the term of this patent is extended or adjusted under 35 U.S.C. 154(b) by 220 days.

(21) Appl. No.: 12/309,658

(22) PCT Filed: Jul. 5, 2007

(86) PCT No.: PCT/DE2007/001186
§ 371 (c)(1),
(2), (4) Date: Jan. 26, 2009

(87) PCT Pub. No.: WO2008/011859
PCT Pub. Date: Jan. 31, 2008

(65) Prior Publication Data
US 2009/0289632 A1    Nov. 26, 2009

(30) Foreign Application Priority Data
Jul. 26, 2006  (DE) .................. 10 2006 034 472

(51) Int. Cl.
*H01F 7/02*  (2006.01)
(52) U.S. Cl. .................................................. 335/306
(58) Field of Classification Search .......... 335/306, 335/284; 324/318; 123/538; 210/222
See application file for complete search history.

(56) References Cited

U.S. PATENT DOCUMENTS

| 4,167,718 A * | 9/1979 | Harada et al. ............. 335/284 |
| 4,820,988 A * | 4/1989 | Crooks et al. ............. 324/318 |
| 4,862,128 A * | 8/1989 | Leupold ................... 335/306 |
| 4,911,627 A * | 3/1990 | Leupold .................... 425/3 |
| 5,319,335 A * | 6/1994 | Huang et al. .............. 335/284 |
| 5,558,765 A | 9/1996 | Twardzik |
| 6,989,730 B1 * | 1/2006 | Leupold ................... 335/306 |
| 2004/0008499 A1 | 1/2004 | Chiang |

(Continued)

FOREIGN PATENT DOCUMENTS

DE        295 15 545        1/1996

(Continued)

OTHER PUBLICATIONS

H. Raich, et al.; "Design and Construction of a Dipolar Halbach Array with a Homogeneous Field from Identical Bar Magnets: NMR Mandhalas"; Concepts in Magnetic Resonance, vol. 23B, 2004 pp. 16-25.

(Continued)

*Primary Examiner* — Ramon Barrera
(74) *Attorney, Agent, or Firm* — Jordan and Hamburg LLP

(57) ABSTRACT

Disclosed is an apparatus for application of a magnetic field to a sample, in particular an elongated sample. At least in places, the apparatus has magnetic bodies which are arranged such that they can rotate with respect to one another and have, and leave open, a common access opening for the sample. In particular, this allows the apparatus to be applied to an elongated sample whose ends are not accessible. As a result of the bodies being arranged such that they can rotate with respect to one another, the magnetic fields of the bodies can be adjusted with respect to one another before the apparatus is opened and closed, so as to minimize the magnetic field in the common access opening. In consequence, only small magnetic interaction forces need be overcome during opening and closing.

15 Claims, 4 Drawing Sheets

U.S. PATENT DOCUMENTS

2005/0210629 A1    9/2005    Seidler et al.

FOREIGN PATENT DOCUMENTS

| | | |
|---|---|---|
| DE | 203 10 453 | 12/2003 |
| EP | 0 481 761 | 4/1992 |
| EP | 0 698 732 | 2/1996 |
| GB | 2 312 097 | 10/1997 |

OTHER PUBLICATIONS

G. Eidmann, et al.; "The NMR Mouse, A Mobile Universal Surface Explorer"; Journal of Magnetic Resonance, Series A, vol. 122, Sep. 1996, pp. 104-109.

J.M.D. Coey; "Permanent magnet applications"; Journal of Magnetism and Magnetic Materials, 248, (2002), pp. 441-456.

\* cited by examiner

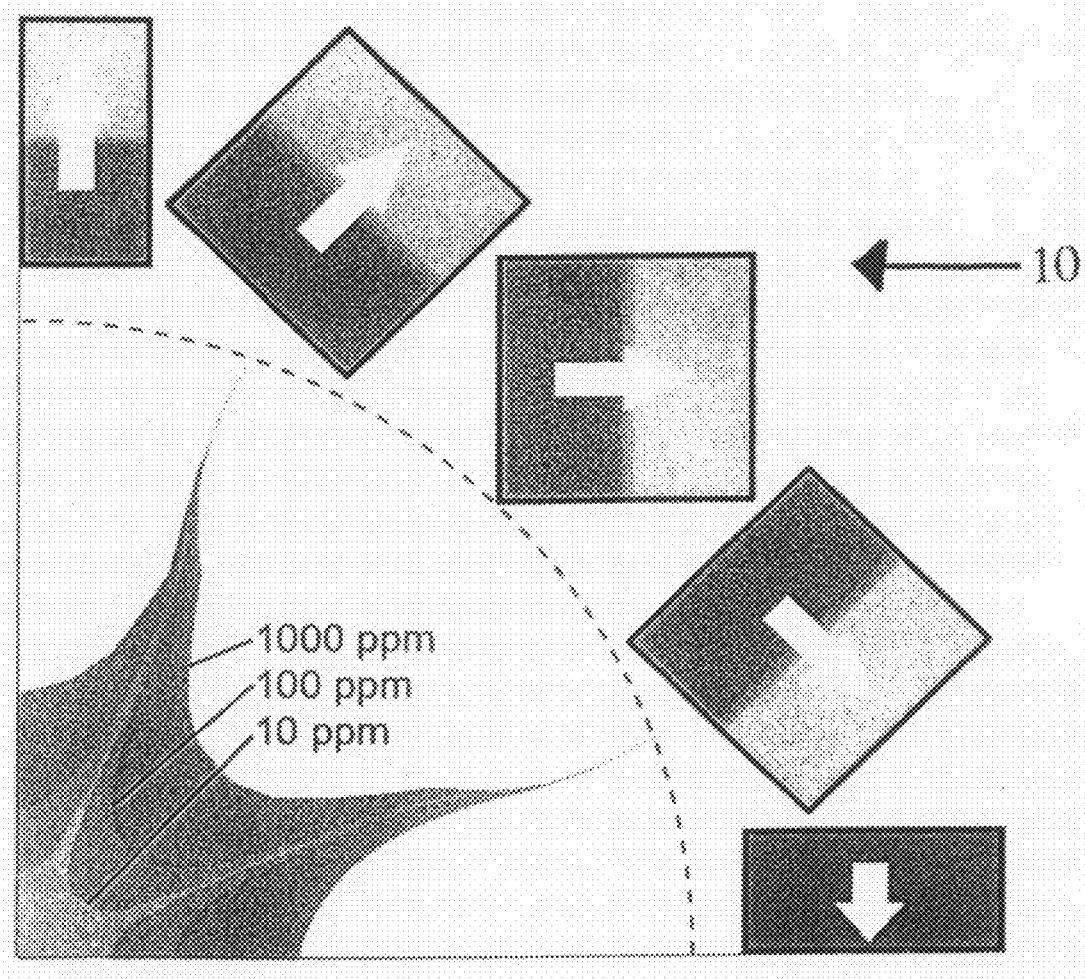

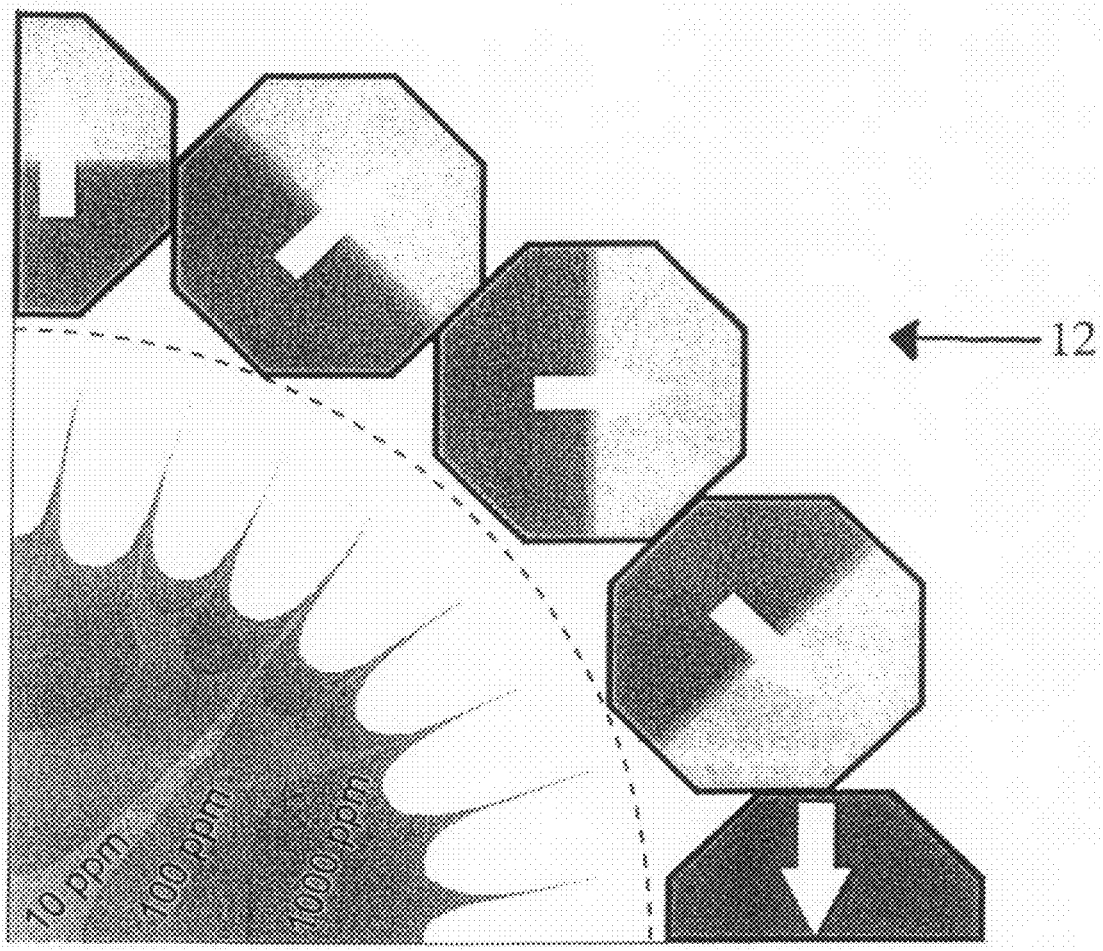

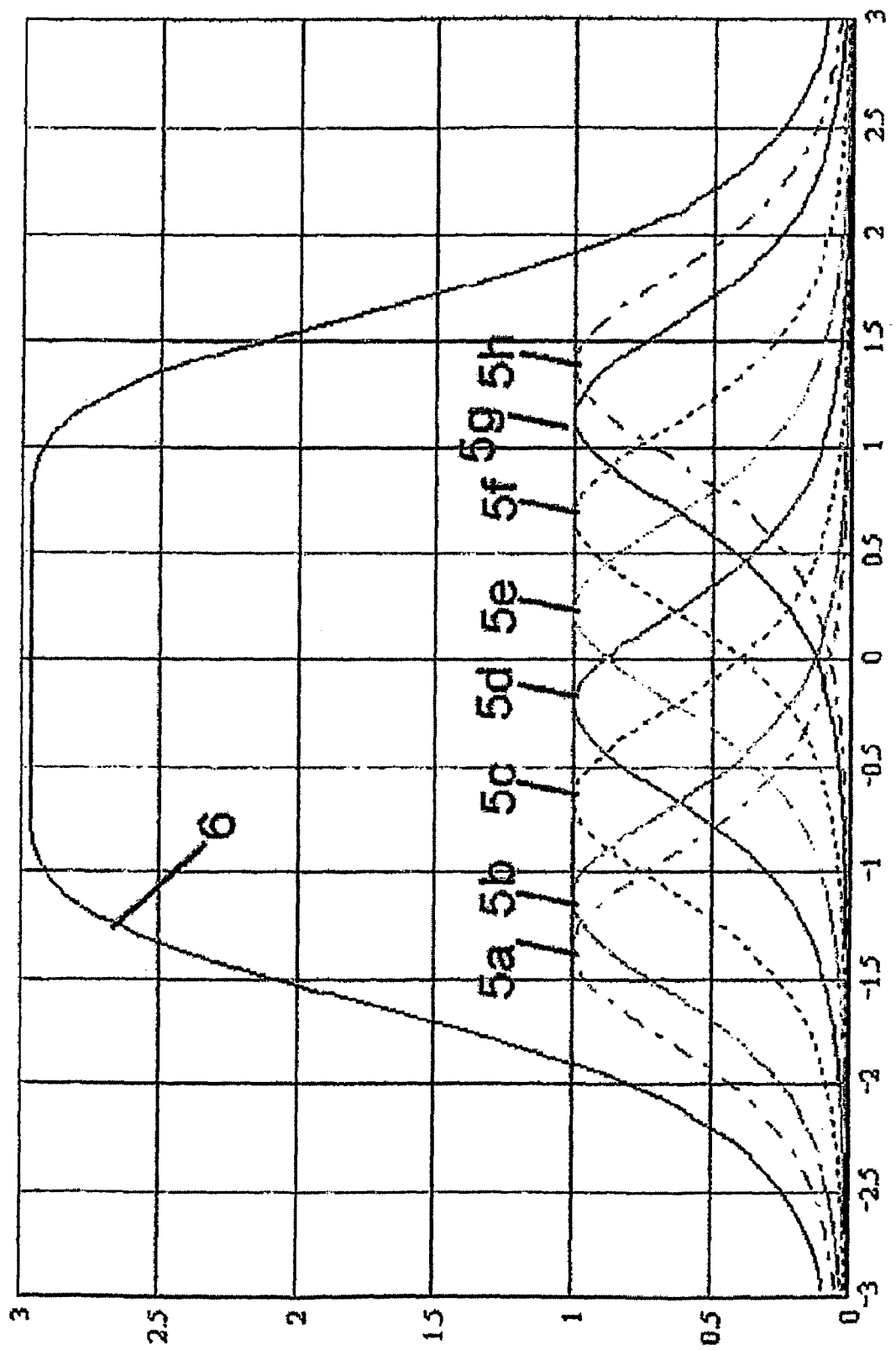
Figur 3

APPARATUS FOR APPLICATION OF A MAGNETIC FIELD TO A SAMPLE

The invention relates to an apparatus for applying a magnetic field to a sample.

STATE OF THE ART

Hidden structures, and particularly defects, on the insides of samples can be located using magnetic resonance methods, such as electron spin or nuclear magnetic resonance. In the process, a static magnetic field is applied to the sample. This magnetic field eliminates the degeneration of quantum mechanical states in the sample, which is to say it causes different states to be associated with different energy levels. In addition, a high-frequency magnetic field is coupled to the sample, which brings about transitions between these states under resonance.

In particular, for nuclear magnetic resonance, the static magnetic field must be very strong and must also be homogeneous. For mobile applications, it is advisable to use magnetic arrangements comprising magnetic rings, as a strong and largely homogeneous magnetic field develops within these arrangements.

The disadvantage is that these rings cannot be used in order to apply a strong and homogeneous magnetic field of this sort to the interior of elongate samples, the ends of which are not accessible. Examples of such samples are tree trunks or pipes.

OBJECT AND SOLUTION

The object of the invention is therefore to provide an apparatus, which allows a magnetic field, which is as strong and as homogeneous as possible, to be applied, particularly to the interior of elongate samples, the ends of which are not accessible.

This object is achieved according to the invention by apparatuses according to the appended claims, and by stacking apparatuses according to the invention. Further advantageous embodiments will be apparent from the following description.

SUBJECT MATTER OF THE INVENTION

As part of the invention, an apparatus was developed for applying a magnetic field to a sample. This apparatus comprises at least two, at least partially magnetic, loop-shaped bodies having a common passage for the sample, the bodies being disposed rotatably relative to one another.

In particular, the sample can be elongate. Examples of elongate samples are a tree or a pipe, the inside of which is to be analyzed using a magnetic resonance method and to which, therefore, a magnetic field must be applied.

In addition to two-dimensional structures, such as a ring or a rectangular loop, a loop-shaped body as defined by the invention shall also encompass three-dimensional structures, such as a hemisphere, enclosing a space at least partially.

The two-dimensional structures may include circular rings, or rings that deviate from the circular shape, such as ellipses, or other shapes deviating from the exact circular shape. It is also possible to use other polygonal rings. Equivalent geometries can also have a three-dimensional configuration.

The common passage is advantageous in that the apparatus can completely enclose an elongate sample and thus apply a magnetic field thereto from all sides. This is particularly important if the magnetic field to be produced in the elongate sample is to be as homogeneous as possible.

The bodies are disposed rotatably relative to one another in order to be able to regulate the direction and strength of the resulting magnetic field in the sample, produced by the cooperation thereof by way of the positions thereof, relative to one another. In general, the bodies are rotated relative to one another in a coplanar manner.

It is possible to dispose more than two, for example three or four, bodies so that they are rotatable relative to one another. In this way, for example, the accuracy with which the desired field distribution is achieved in the common passage can be improved.

The bodies can be rotated relative to one another, for example, if they are disposed rotatably in a plane and the largest outside diameter of one body is less than the smallest inside diameter of the other body.

However, for example, two rings, which are each rotatably supported and placed on top of each other, preferably having identical dimensions, can be also be rotated relative to one another.

According to the invention, the bodies each comprise at least two segments connected by coupling means, wherein at least one coupling means is detachably configured on each body and at least one other coupling means allows a folding movement.

For example, a buckle or a screw cap is suitable as a detachably configured coupling means.

A hinge is suited, for example, as a coupling means that allows a folding movement.

Since the apparatus is divided into segments connected by coupling means, it can be placed around an elongate sample, the ends of which are not accessible, and completely encircle the same. In this state, the apparatus can apply a magnetic field to the sample from all sides. Examples of elongate samples, the ends of which are not accessible, are tree trunks or pipes.

It was recognized that, in this process, the cooperative action involving the rotatable positioning of the bodies relative to one another is important. As a result of the rotatable positioning, the bodies can be moved into a position relative to one another in which the resulting magnetic field is diminished, or vanishes, in the common passage, as well as on the detachably configured coupling means. In this way, the apparatus can be opened and closed with little effort. For the actual analysis of the sample, after locking the detachably configured coupling means, the bodies can be moved into a position relative to one another in which the resulting magnetic field in the common passage, and therefore also in the sample, exhibits defined advantageous properties. For example, for nuclear magnetic resonance analyses, the field can be adjusted to be as strong and homogeneous as possible. For electron spin resonance analyses, a field can be adjusted, so that the strength corresponds as precisely as possible to a predefined value. Electron spin resonance employs microwaves, for which only sources (klystrons) having defined fixed frequencies or frequency bands are available. The magnetic field must be adjusted to these fixed frequencies or frequency bands.

As it can be opened and closed with little effort, the apparatus is not only more convenient to handle, but occupational safety is also higher when handling the apparatus. At technically significant magnetization levels for the bodies, segments of an individual body connected by the detachably configured coupling means can attract or reject each other with forces that are entirely sufficient to sever a finger.

Alternatively, the bodies each comprise at least two segments connected by coupling means, wherein at least two couplings means on each body are detachably configured. By detaching the coupling means, each body can then be broken down into at least two parts. These parts can then be placed around the sample and reconnected by locking the coupling means. In a manner analogous to that of the case described above, the magnetic field in the common passage can be minimized by bringing the bodies into an appropriate position relative to one another, before separating or connecting the parts.

The bodies can also comprise more than two, for example three or four, segments. This is advantageous for larger bodies, since the individual segments can then be handled more easily due to their lower dead weight.

In a particularly advantageous embodiment of the invention, the bodies are rotationally-symmetrical, and in particular are rings, preferably concentric rings. These can be rotated relative to one another with low torque, and leave a comparatively large common passage open for the sample.

The rings can be disposed in a coplanar manner. This is advantageous if the apparatus is to be closed around an elongate sample, the ends of which are not accessible. In general, only a coplanar, or nearly coplanar, rotation of the rings relative to one another is possible in this case. "Nearly coplanar" as defined by the invention shall also mean rings that are tilted relative to one another by up to 10 degrees.

In a particularly advantageous embodiment of the invention, loop-shaped bodies are made of non-ferromagnetic material, such as aluminum, and they comprise permanent magnets. NdFeB and/or Sm2Co7 are particularly suitable materials for the permanent magnets. It is very difficult to produce a loop that is made completely of magnetic material and which creates a technically significant magnetic field distribution at an interior of the common passage. The loop would have to be divided into so many sections having different magnetization levels that it would be impossible to maintain the desired field distribution with sufficient accuracy, which is inherently based upon the manufacturing tolerances of the sections. For production-related reasons, the field strengths of nominally identical permanent magnets deviate on either side of the nominal value in a range of up to 5 percent.

In contrast, the arrangement of the permanent magnets on, at, or in the non-ferromagnetic loop-shaped body can be mechanically controlled with great precision. In addition, identical permanent magnets can be used, which are oriented differently only along the loop circumference. As a result, only one type of permanent magnet need be produced. This can be implemented with the necessary accuracy.

Those skilled in the art can employ common methods, such as finite element calculation, to determine specifically how the permanent magnets must be distributed across the loop in order to generate a given field distribution at the interior.

In a particularly advantageous embodiment, the permanent magnets are disposed according to Halbach geometry (J. M. D. Coey, "Permanent Magnet Applications", Journal of Magnetism and Magnetic Materials 248, 441-456 (2002)), and particularly according to Mandhala geometry (H. Raich, P. Blümler: "Design and Construction of a Dipolar Halbach Array with a Homogeneous Field from Identical Bar Magnets: NMR Mandhalas", Concepts in Magnetic Resonance B 23B(1), 16-25 (2004)). In this way, the field at the interior of the common passage is particularly homogeneous. This is particularly advantageous for nuclear magnetic resonance analyses. According to the gyromagnetic ratio, the narrow bandwidth of the excitation pulses employed for these analyses corresponds only to a narrow range of magnetic field strengths to which these excitation pulses fit. If the magnetic field were not sufficiently homogeneous, only part of the sample would be excited by the pulses, and the measurement would be distorted. For an arrangement of permanent magnets according to Halbach or Mandhala geometry, rings are particularly advantageous as the loop-shaped bodies.

In an advantageous embodiment of the invention, the permanent magnets have a polygonal cross-section, and particularly a cross-section having n/2 corners for an even number n of magnets used. In this way, the magnetic field at the center of the common passage becomes both stronger and more homogeneous, and the region in which the magnetic field has this homogeneity increases. This is advantageous for nuclear magnetic resonance analyses, in which the requirements in terms of the homogeneity of the field are particularly high.

The concentric rings can also be energized coils. A non-ferromagnetic ring comprising permanent magnets, however, has the advantage that it does not require an energy source for maintaining the magnetic field.

In a further advantageous embodiment of the invention, the magnetic remanence field of each body is lower than the magnetic coercive field thereof. Then, the two bodies can be disposed closely adjacent to each other, without running the risk of permanently changing the magnetization (reversing the polarity) of the one body by that of the other body.

Advantageously, the bodies make identical, or nearly identical, contributions to the magnetic field in the common passage. This field can then be almost neutralized by the rotation of the two bodies relative to one another. In this case, the apparatus can be closed around the elongate sample and opened again in a substantially force-free manner. Typically, the apparatus is configured such that a rotation of the bodies relative to one another by about 180 degrees is required in order to switch between the maximum and minimum magnetic fields in the common passage.

As part of the invention, a stacked configuration comprising a plurality of apparatuses according to the invention was developed, these apparatuses having concentric rings as the bodies. In this arrangement, all the apparatuses have a common passage. In this way, a larger volume of sample can be analyzed at one time.

A common passage shall be defined particularly as one wherein a rigid elongate sample can penetrate the stacked configuration. For example, the stacked configuration can be guided along a tree trunk or a pipe.

In a particularly advantageous embodiment of the invention, the apparatuses are disposed at distances from one another such that the change of the magnetic field along the common axis of symmetry of the apparatuses is minimized over the largest possible region around the center of the stack. This criterion can be investigated experimentally by measuring the field along the axis of symmetry during the adjustment. Since the magnetic field distributions generated by the apparatuses are known, however, it is also possible to calculate the optimum distances in advance by way of computer simulation. Only the deviances of the actual magnetic distributions from the models used in the computer simulation would then have to be readjusted in the experiments.

If the magnetic field along the common axis of symmetry of the apparatuses is constant, or nearly constant, it also remains advantageously homogeneous in a large radius around the axis of symmetry.

With respect to the homogeneity of the field in the common passage, a stacked configuration in which the apparatuses are disposed mirror-symmetrically around the center of the stack has proven to be particularly advantageous.

In a particularly advantageous embodiment of the invention, at least one coil is disposed in the common passage, for applying a magnetic gradient field to this common passage. In addition to the static magnetic field produced by the stacked configurations, many magnetic resonance analyses, for example nuclear magnetic resonance, generally require such a gradient field.

In order to use the least amount of space possible in the common passage for the coil, at least one flat coil is advantageous.

Flat coils, as defined by this invention, are not necessarily planar, they can also be arched. In particular, they can be attached to the circumferential area of a hollow cylinder. In particular, a hollow cylinder comprising at least two flat coils is advantageous. In addition, in experiments, it was also found that the hollow cylinder produces a particularly homogeneous gradient field at the interior thereof, particularly if the geometric centers of at least two flat coils are located distant from each other by an amount corresponding to 1.3 times to 1.6 times the hollow cylinder radius. A practical example using $2^{0.5}$ as the factor was implemented.

A gradient in multiple spatial directions can advantageously be adjusted with an arrangement of concentric hollow cylinders, each comprising at least two flat coils. This arrangement may particularly comprise one hollow cylinder per spatial direction in which the field is to have a gradient. Identical hollow cylinders can be used for the two spatial directions in the plane of the rings, the cylinders only being offset at an angle from each other. In order to pick up the spatial direction along the common rotation axis of the stacked configurations as well, the arrangement advantageously comprises a hollow cylinder, the flat coils of which correspond to the flat coils rotated by 80 to 100 degrees on another hollow cylinder.

BRIEF DESCRIPTION OF THE DRAWINGS

Below, the subject matter of the invention will be described in more detail based on figures, without limiting the subject matter of the invention thereby. Shown are:

FIGS. 1a-1c: wherein embodiments of the present invention shown in varied states wherein FIGS. 1a and 1b shows an embodiment with a hinge connection and FIG. 1c shows an embodiment with two detachable connections.

FIG. 2a: Section of first example of a body of the apparatus.

FIG. 2b: Section of a second example of a body of the apparatus.

FIG. 3: Example of the optimization of the distances of a plurality of apparatuses in a stacked configuration.

DETAILED DESCRIPTION

Figure 1A:
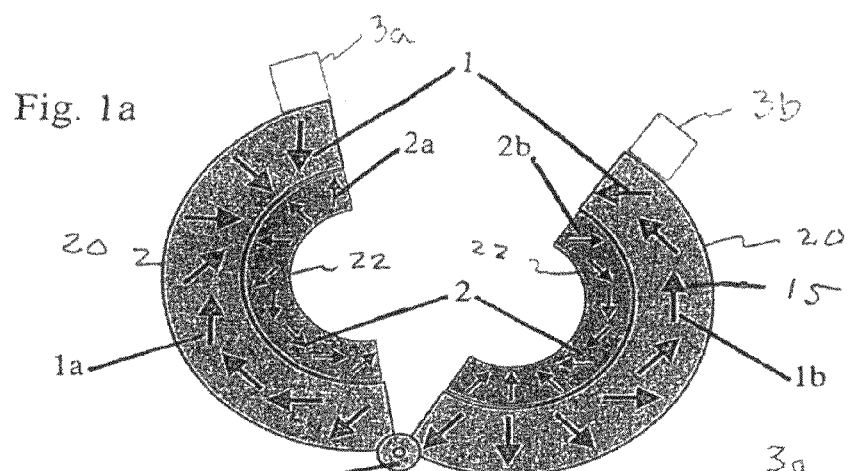
Figures 1B, 1C:
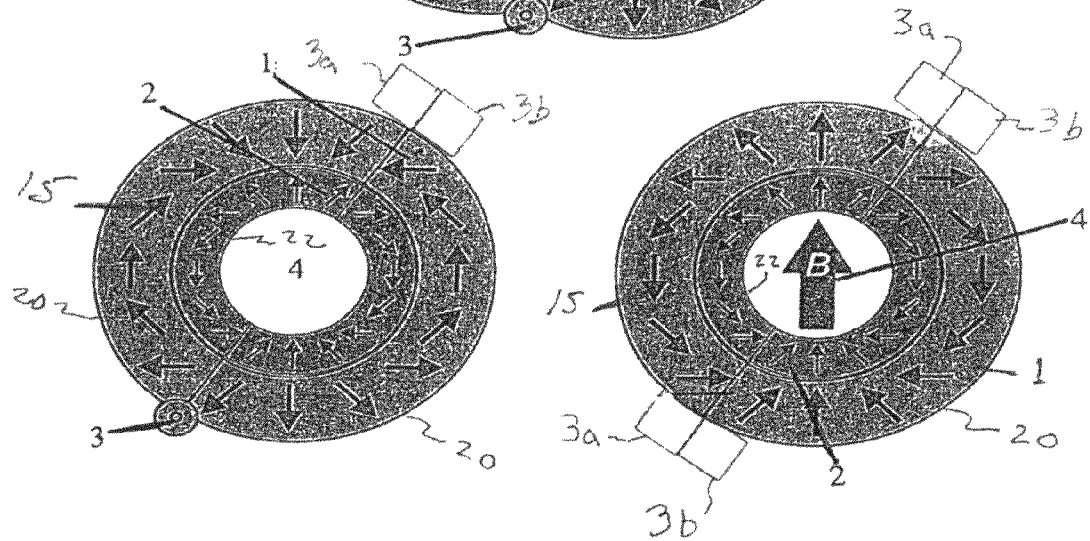

FIGS. 1a-1c show examples of states of an apparatus according to the invention which includes two partially magnetic loop-shaped bodies 1 and 2, having loop-shaped body 1 comprising two segments 1a and 1b, and having loop-shaped body 2 comprising two segments 2a and 2b. The two segments of a body, 1 or 2, are connected to one another by coupling means. FIGS. 1a-1b a hinge 3 is shown as a coupling means allowing a folding movement by pivoting. A detachably configured coupling means likewise provided according to the invention is shown generically by blocks representing detachable coupling portions 3a and 3b which detachably engage one another. The bodies 1 and 2 are disposed rotatably relative to one another in FIGS. 1a and 1b and have a common passage 4. The bodies are concentric, coplanar rings. FIG. 1c shows an option variation of the embodiment of FIGS. 1a and 1b wherein the hinge 3 is replaced with a second detachably configured coupling means shown generically by blocks representing detachable coupling portions 3a and 3b which detachably engage one another. As examples of possible detachable coupling means, embodiments of the invention include detachable coupling portions 3a and 3b being halves of a buckle or a screw cap suitable as a detachably configured coupling means.

In FIG. 1a, the detachably configured coupling means has portions 3a and 3b open, in FIGS. 1b and 1c the portions 3a and 3b closed wherein in FIG. 1c portions 3a and 3b of both coupling means are closed.

FIGS. 1b and 1c illustrate the influence of rotation of the two bodies 1 and 2 relative to one another on the magnetic field in the common passage 4.

In FIG. 1b, the magnetic fields brought about by the bodies 1 and 2 almost cancel each other. This is the state in which the apparatus can be opened and closed with little effort.

In FIG. 1c, the magnetic fields brought about by the bodies 1 and 2 are increased. This is the state in which a maximum magnetic field is present in the common passage 4. The transition between the states of FIGS. 1b and 1c corresponds to a rotation of the bodies 1 and 2 relative to one another by 180 degrees about the common axis of symmetry.

FIG. 2a shows sections of examples of a body of the apparatus. The body is made of 16 nominally identical permanent magnets, which are disposed according to Mandhala geometry and each has a polygonal cross-section having an even number of corners. In the example shown in FIG. 2a, permanent magnets 10, shown schematically as arrows 15 in FIGS. 1a-1c, have four corners, and in the example shown in FIG. 2b permanent magnets 12 have eight corners. On the bottom left, regions are shown, in which a field in plane of the passage is homogeneous up to the specified tolerance limits of 10 ppm, 100 ppm, and 1000 ppm. When using eight instead of four corners, the homogeneity of the field that can be achieved is not only considerably better, it is also 28 percent stronger at 0.41, as compared to 0.32, Tesla. The spatial area which can be used as the common passage and which is enclosed by the bodies, as marked by the dotted circular line, is of equal size in the two examples.

A particularly advantageous embodiment of the invention, has the loop-shaped bodies 1 and 2 are made housings 20 and 22, shown in FIGS. 1a-1c of non-ferromagnetic material, such as aluminum, that include permanent magnets, 10 or 12, of FIGS. 2a and 2b as represented by the arrows 15. Materials such as NdFeB and/or Sm2Co7 are particularly suitable materials for the permanent magnets. This arrangement is advantageous because it is very difficult to produce a loop that is made completely of magnetic material and which creates a technically significant magnetic field distribution at an interior of the common passage. The loop would have to be divided into so many sections having different magnetization levels that it would be impossible to maintain the desired field distribution with sufficient accuracy, which is inherently based upon the manufacturing tolerances of the sections. For production-related reasons, the field strengths of nominally identical permanent magnets deviate on either side of the nominal value in a range of up to 5 percent.

In contrast, the arrangement of the permanent magnets, 10 or 12, on, at, or in the non-ferromagnetic housings, 20 and 22, of loop-shaped bodies, 1 and 2, can be mechanically controlled with great precision. In addition, identical permanent magnets as shown in FIGS. 2a and 2b can be used, which are oriented differently only along the loop circumference. As a result, only one type of permanent magnet need be produced. This can be implemented with the necessary accuracy.

FIG. 3 shows an example of optimization of the distances of a plurality of apparatuses in a stacked configuration. The apparatuses in this example comprise concentric rings as the loop-shaped bodies. All rings present in the stacked configuration have a common axis of symmetry. The distance from the center of the stacked configuration is shown on the ordinate in units of the ring radius, with the ring radius being considered to be the radial distance from the center of the ring to the centers of gravity of the magnets. On the abscissa, the magnetic filed measured on the common axis of symmetry is shown in arbitrary units. The stacked configuration comprises eight apparatuses a to h; the curves 5a to 5h show the course of the magnetic fields brought about by these apparatuses at each point on the common axis of symmetry. The curve 6 is the sum of all curves 5a to 5h and indicates the resulting magnetic field at each point of the common axis of symmetry. The distances between the maxima of curves 5a to 5h correspond to the distances of the apparatuses from one another, within the stacked configuration. With these distances, which have been optimized numerically with the help of a computer program, the resulting field is largely homogeneous within a wide range around the center of the stacked configuration, which is apparent from a flat course of curve 6 in this region.

Below, optimized positions for the apparatuses on the common axis of symmetry are provided by way of example, wherein the coordinate has been standardized, as on the ordinate axis from FIG. 3, into units of the ring radius.

2+2+2 apparatuses:
−1.001; −0.654; −0.234; 0.234; 0.654; 1.001
2+4+2 apparatuses:
−1.435; −1.106; −0.675; −0.222; 0.675; 1.106; 1.435
2+6+2 apparatuses:
−1.891; −1.544; −1.125; −0.669; −0.225; 0.225; 0.669; 1.125; 1.544; 1.891

The invention claimed is:

1. An apparatus for applying a magnetic field to a sample, comprising:
   at least first and second bodies each configured as a loop and together arranged to define a common passage for the sample, each of the first and second bodies including magnetic material;
   the first and second bodies being disposed so as to be rotatable relative to one another about a common axis of said common passage;
   each of the first and second bodies comprising at least two segments, the at least two segments of both of the first and second bodies being connected by coupling devices, the coupling devices and the segments being configured to provide for selective displacement of a first set of segments formed of segments of each of said first and second bodies relative to a second set of segments formed of segments of each of said first and second bodies from a closed loop relative position to an open loop relative position creating an opening between said first set of segments and said second set of segments breaking said loops and permitting introduction of said sample into said common passage through said opening;
   said second body being disposed within said first body so as to rotate relative said first body about the common axis of the common passage;
   said at least two segments of said first body each including as the magnetic material permanent magnets arranged circumferentially with varying orientations relative circumferentially adjacent ones of said magnets to form a first circuitous magnetic array;
   said at least two segments of said second body each including as the magnetic material permanent magnets arranged circumferentially with varying orientations relative circumferentially adjacent ones of said magnets to form a second circuitous magnetic array; and
   said first magnetic array and said second magnetic array being rotatable relative each other from a first position whereat the first and second magnetic arrays align to constructively combine magnetic fields to provide a maximum magnetic field in said common passage, to a second position whereat the first and second magnetic arrays align to destructively combine magnetic fields to provide a minimum magnetic field in said common passage with said first set of segments aligned and said second set of segments aligned to permit said selective displacement of said first set of segments relative to said second set of segments to said open loop relative position facilitated by the minimum magnetic field minimizing force required for said selective displacement to said open loop position to form said opening and allow introduction of said sample through said opening;
   wherein the first and second bodies are made of non-ferromagnetic material housing the magnets as the magnetic material; and
   wherein the permanent magnets have a polygonal cross-section having n/2 corners for an even number n of permanent magnets used.

2. An apparatus according to claim 1 wherein the coupling devices include a hinge.

3. An apparatus according to claim 1 wherein the first and second bodies are each a rotationally-symmetrical body.

4. The apparatus according to claim 3, wherein the first and second bodies are rings.

5. An apparatus according to claim 4 wherein the rings are disposed in a coplanar manner.

6. The apparatus according to claim 1, wherein the first and second bodies are concentric rings.

7. The apparatus according to claim 1, wherein the permanent magnets are made of NdFeB and/or Sm2Co7.

8. An apparatus according to claim 1, wherein the permanent magnets are disposed according to Halbach geometry.

9. The apparatus according to claim 1, wherein the permanent magnets are disposed according to Mandhala geometry.

10. The apparatus according to claim 9, wherein the permanent magnets have a polygonal cross-section.

11. An apparatus according to claim 1 wherein a magnetic remanence field of each said first and second bodies is lower than the magnetic coercive field thereof.

12. An apparatus according to claim 1 wherein the first and second bodies make identical, or nearly identical, contributions to the magnetic field in the common passage.

13. The apparatus according to claim 1 wherein:
   said first and second bodies are configured as concentric rings with said second body disposed within said first body so as to rotate relative said first body about the common axis of the common passage;
   said at least two segments of said first body each include said magnets arranged circumferentially with said varying orientations relative circumferentially adjacent ones of said magnets to form a first circular magnetic array; and
   said at least two segments of said second body each include said magnets arranged circumferentially with said varying orientations relative circumferentially adjacent ones of said magnets to form a second circular magnetic array.

14. The apparatus according to claim 13 wherein:
   positioning said first and second magnetic arrays into said second position aligns said first set of segments such that a first half of said first body is aligned with a first half of said second body in a first common semicircle arrangement;

positioning said first and second magnetic arrays into said second position aligns said second set of segments such that a second half of said first body is aligned with a second half of said second body in a second common semicircle arrangement; and said coupling devices include a pivot device connecting said first half of said first body with said second half of said first body such that said first common semicircular arrangement is pivotal relative to said second common semicircular arrangement permitting displacement of said first common semicircular arrangement relative to said second common semicircular arrangement to permit introduction of a sample into said common passage through said opening.

15. The apparatus according to claim 13 wherein:

positioning said first and second magnetic arrays into said second position aligns said first set of segments such that a first half of said first body is aligned with a first half of said second body in a first common semicircle arrangement;

positioning said first and second magnetic arrays into said second position aligns said second set of segments such that a second half of said first body is aligned with a second half of said second body in a second common semicircle arrangement; and said coupling devices connecting said first half of said first body with said second half of said first body such that said first common semicircular arrangement is displaceable relative to said second common semicircular arrangement permitting displacement of said first common semicircular arrangement relative to said second common semicircular arrangement to permit introduction of a sample into said common passage through said opening.

* * * * *